United States Patent
Ramaswamy et al.

(10) Patent No.: US 10,784,085 B2
(45) Date of Patent: Sep. 22, 2020

(54) PLASMA PROCESSING REACTOR WITH A MAGNETIC ELECTRON-BLOCKING FILTER EXTERNAL OF THE CHAMBER AND UNIFORM FIELD WITHIN THE CHAMBER

(71) Applicant: APPLIED MATERIALS, INC., Santa Clara, CA (US)

(72) Inventors: Kartik Ramaswamy, San Jose, CA (US); Kenneth S. Collins, San Jose, CA (US); Steven Lane, Porterville, CA (US); Yang Yang, Los Gatos, CA (US); Lawrence Wong, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 1241 days.

(21) Appl. No.: 14/832,280

(22) Filed: Aug. 21, 2015

(65) Prior Publication Data
US 2016/0225466 A1 Aug. 4, 2016

Related U.S. Application Data

(60) Provisional application No. 62/112,029, filed on Feb. 4, 2015.

(51) Int. Cl.
*H05H 1/12* (2006.01)
*H01J 37/32* (2006.01)

(52) U.S. Cl.
CPC .... *H01J 37/32357* (2013.01); *H01J 37/3266* (2013.01); *H01J 37/32422* (2013.01)

(58) Field of Classification Search
CPC .......... H01J 37/32357; H01J 37/32422; H01J 37/3266
See application file for complete search history.

(56) References Cited

U.S. PATENT DOCUMENTS

| | | | | |
|---|---|---|---|---|
| 6,190,495 B1* | 2/2001 | Kubota | ..................... | C23F 4/00 118/723 MA |
| 2004/0094509 A1* | 5/2004 | Miyata | ................ | H01J 37/3266 216/70 |
| 2011/0056912 A1* | 3/2011 | Matsuyama | ...... | H01J 37/32623 216/59 |
| 2012/0034136 A1* | 2/2012 | Collins | ............. | H01J 37/32091 422/186.29 |

* cited by examiner

*Primary Examiner* — Marshall P O'Connor
(74) *Attorney, Agent, or Firm* — Fish & Richardson P.C.

(57) ABSTRACT

An external magnetic filter to trap electrons surrounds a reactor chamber and has multiple magnets arranged in a circle, the magnetic orientation of each individual magnet being rotated relative to the orientation of the adjacent individual magnet by a difference angle that is a function of the arc subtended by the individual magnet.

14 Claims, 7 Drawing Sheets

PLASMA PROCESSING REACTOR WITH A MAGNETIC ELECTRON-BLOCKING FILTER EXTERNAL OF THE CHAMBER AND UNIFORM FIELD WITHIN THE CHAMBER

CROSS-REFERENCE TO RELATED APPLICATIONS

This application claims benefit of U.S. Provisional Application Ser. No. 62/112,029, filed Feb. 4, 2015 entitled PLASMA PROCESSING REACTOR WITH A MAGNETIC ELECTRON-BLOCKING FILTER EXTERNAL OF THE CHAMBER AND UNIFORM FIELD WITHIN THE CHAMBER, by Kartik Ramaswamy, et al.

BACKGROUND

1. Technical Field

The disclosure concerns a plasma processing reactor having a magnetic filter.

2. Background Discussion

A plasma is a source of negative ions, electrons and positive ions. In typical plasma, electrons are much more mobile than ions and as a result of this: (a) a positive ion-dominated sheath region is formed at the boundaries of the plasma, to maintain the quasi neutrality of the plasma; and (b) negative ions trapped in the bulk plasma are unable to overcome this potential boundary. The electrons and ions have different angular distributions. This causes a problem while etching small contacts and trenches (for example) on semiconductor wafers. Different angular distributions of electrons and ions cause differential charge-related etching distortion of the feature. The top section of the feature may be negatively charged while the bottom section of the feature may be positively charged. One solution to this problem is to use negative ions and positive ions to do the etching while minimizing the impact of electrons.

For this purpose, a magnetic filter (for trapping electrons) is typically placed between two chambers. A plasma source is used to generate plasma in the top chamber. The transverse magnetic field of the magnetic filter traps electrons. As a result the plasma in the bottom chamber has a preponderance of negative ions and positive ions of similar mobilities. The plasma electron temperature is much colder (compared to the top chamber). This promotes electron attachment, contributing to the formation of negative ions in the lower chamber.

The magnetic filters that have been used previously are either physically immersed in the plasma (plasma immersed) or highly non-uniform. Plasma immersed filters need to be cooled. For example, permanent magnets loose magnetization if the temperatures rise beyond Curie temperatures. A significant problem with plasma immersed filters is that they contribute to material contamination on the workpiece or wafer.

SUMMARY

A plasma reactor comprises an enclosure comprising upper and lower chambers separated at an interface zone, a plasma source coupled to the upper chamber and a process chamber coupled to the lower chamber, the process chamber containing a workpiece support. A circular magnetic array surrounds the interface zone and is located outside of the enclosure, and comprises a circular succession of individual magnets of individual magnetic orientations, the individual magnetic orientation of each respective magnet being in a direction that is a function of the angular location of the respective individual magnet in the circular magnetic array.

In one embodiment, the function is such that the direction lays at an angle twice the angle of the angular location. In one embodiment, the individual magnetic orientations are distributed in conformance with a Halbach array.

In one embodiment, the array of magnets is rotatable relative to the process chamber about an axis of symmetry of the circular magnetic array, the reactor further comprising a rotation actuator coupled to the circular magnetic array.

In one embodiment, the interface zone comprises a magnetically transparent ring.

In one embodiment, each one of the individual magnets is shaped as an arcuate section, the arcuate section spanning an angle equal to 360 degrees divided by the number of individual magnets in the circular magnetic array.

In one embodiment, the succession of individual magnets comprises an annular substrate and successive magnetic inserts embedded in the annular substrate.

The array of magnets is in the shape of a ring or a cylinder. The individual magnets comprise permanent magnets or electromagnets.

In one embodiment, the reactor further comprises an ion extractor between the lower chamber and the process chamber. In one embodiment, the ion extractor comprises a pair of opposing grids and an AC source having opposing terminals coupled to the opposing grids.

In accordance with a different aspect, a plasma reactor comprises an enclosure, a plasma source coupled to one end of the enclosure and a process chamber coupled to an opposite end of the enclosure, and a circular magnetic array surrounding the enclosure and located outside of the enclosure, and comprising a circular succession of individual magnets of individual magnetic orientations, the individual magnetic orientation of each respective magnet being in a direction that is a function of the angular locations of the respective individual magnet in the circular magnetic array.

In one embodiment, the function is such that the direction lays at an angle twice the angle of the angular location. In one embodiment, the individual magnetic orientations are distributed in conformance with a Halbach array.

In one embodiment, the array of magnets is rotatable relative to the process chamber about an axis of symmetry of the circular magnetic array, the reactor further comprising a rotation actuator coupled to the circular magnetic array.

In one embodiment, the interface zone comprises a magnetically transparent ring.

In one embodiment, each one of the individual magnets is shaped as an arcuate section, the arcuate section spanning an angle equal to 360 degrees divided by the number of individual magnets in the circular magnetic array.

In one embodiment, the circular succession of individual magnets comprises an annular substrate and successive magnetic inserts embedded in the annular substrate.

The array of magnets is in the shape of a ring or a cylinder. The individual magnets comprise permanent magnets or electromagnets.

In one embodiment, the reactor further comprises an ion extractor between the lower chamber and the process chamber. In one embodiment, the ion extractor comprises a pair of opposing grids and an AC source having opposing terminals coupled to the opposing grids.

In accordance with a yet further aspect, a plasma reactor comprises an enclosure, a plasma source coupled to one zone of the enclosure and a process chamber coupled to another zone of the enclosure; and a circular magnetic array surrounding the enclosure and located outside of the enclosure, and comprising a circular succession of individual magnets of individual magnetic orientations, the individual magnetic orientation of each respective magnet being in a direction that is a function of the angular location of the respective individual magnet in the circular magnetic array.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

A magnetic filter for trapping electrons has a circular array of multiple magnetic dipoles, as either permanent magnets or electromagnets, in a ring configuration or a cylinder configuration. The magnetic filter is outside of the process chamber, avoiding physical contact between the magnetic filter and the plasma. The magnetic filter is based upon the angular distribution of individual magnetic dipoles (permanent magnets or electromagnets). The magnetic field traps the electrons by forcing them to perform cyclotron rotations about the magnetic lines of force. The angular distribution is such that the orientation or angle of each magnetic dipole is a function of its angular location in the circular array. In embodiments described below, the orientation or angle of each magnetic dipole is twice the angle of its location in the circular array. This latter feature is referred to as a Halbach array.

In one embodiment, the structure supporting the magnetic filter can be physically rotated about the chamber axis of symmetry to remove any skew associated with the magnetic field of the magnetic filter.

In a further embodiment, the magnetic filter is combined with an ion-ion plasma source consisting of a chamber divided into an upper chamber and a lower chamber that, in one embodiment, are DC-isolated from each other. A plasma source is coupled to the upper chamber, while a workpiece processing chamber is coupled to the lower chamber. The magnetic filter is aligned with the juncture of the upper and lower chambers, and is external of them. Negative and positive ions are extracted though the bottom of the lower chamber into the workpiece processing chamber by an AC-driven grid. The AC-driven grid extracts negative ions on the negative peak of the AC voltage and extracts positive ions on the positive peak. By trapping electrons at the juncture between the upper and lower chambers, the plasma sheath is minimal in the bottom chamber, because the positive and negative ions have similar mobilities, which facilitates ion extraction.

Figure 1:
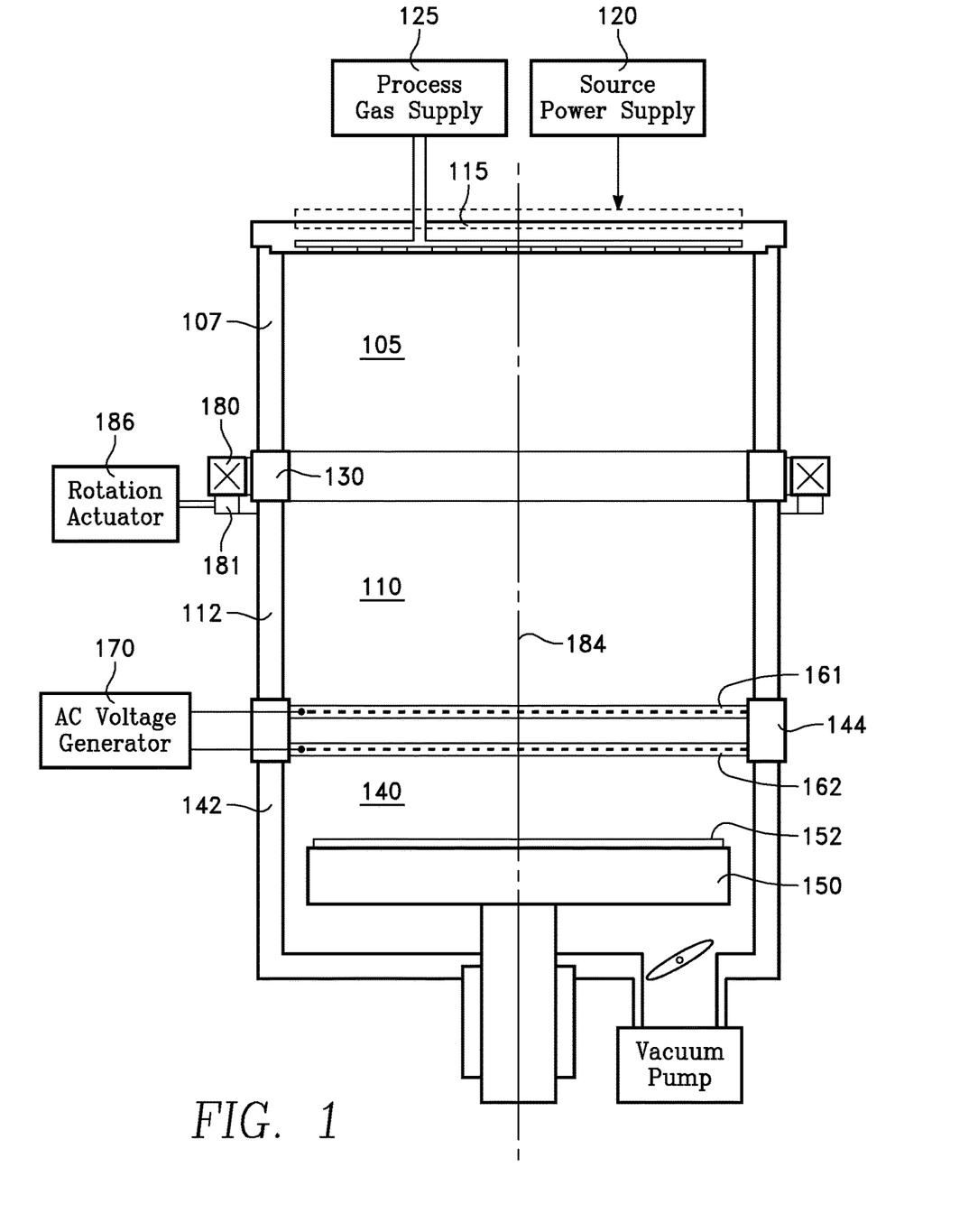
FIG. 1 is a simplified diagram in accordance with an embodiment.

Referring now to FIG. 1, a plasma reactor has a cylindrical upper chamber 105 including a side wall 107 and a cylindrical lower chamber 110 including a side wall 112. The upper and lower chambers 105 and 110 may be coaxial with each other. A plasma source 115 is coupled to the upper chamber 105 and receives plasma source power from a power supply 120 and process gas from a process gas source 125. The side walls 107 and 112 are separated from one another by a ring 130 formed of a material that is at least nearly transparent to a magnetic field. In one embodiment, the ring 130 may be an electrical insulator. A process chamber 140 is open to the bottom of the lower chamber 110 and has a cylindrical side wall 142. An optional insulating ring 144 separates the side walls 112 and 142. A workpiece support 150 within the process chamber 140 supports a workpiece or wafer 152. A pair of ion extraction grids 161, 162 may be supported at the boundary between the lower chamber 110 and the process chamber 140. Optionally the ion extraction grids 161, 162 may be supported on the ring 144. An AC voltage generator 170 has opposing terminals connected to the respective grids 161, 162. In one embodiment, positive and negative ions, respectively, are extracted through the grids 161, 162 during respective half-cycles of the AC voltage generator 170.

A magnetic filter 180 in the shape of a ring or cylinder is located adjacent the ring 130 and outside of the upper and lower chambers 105 and 110. The magnetic filter 180 is coaxial with the upper and lower chambers 105 and 110 and is supported on a rotatable shelf 181 for rotation about the axis of symmetry 184. A rotation actuator 186 is coupled to the rotatable shelf 181.

Figure 2:
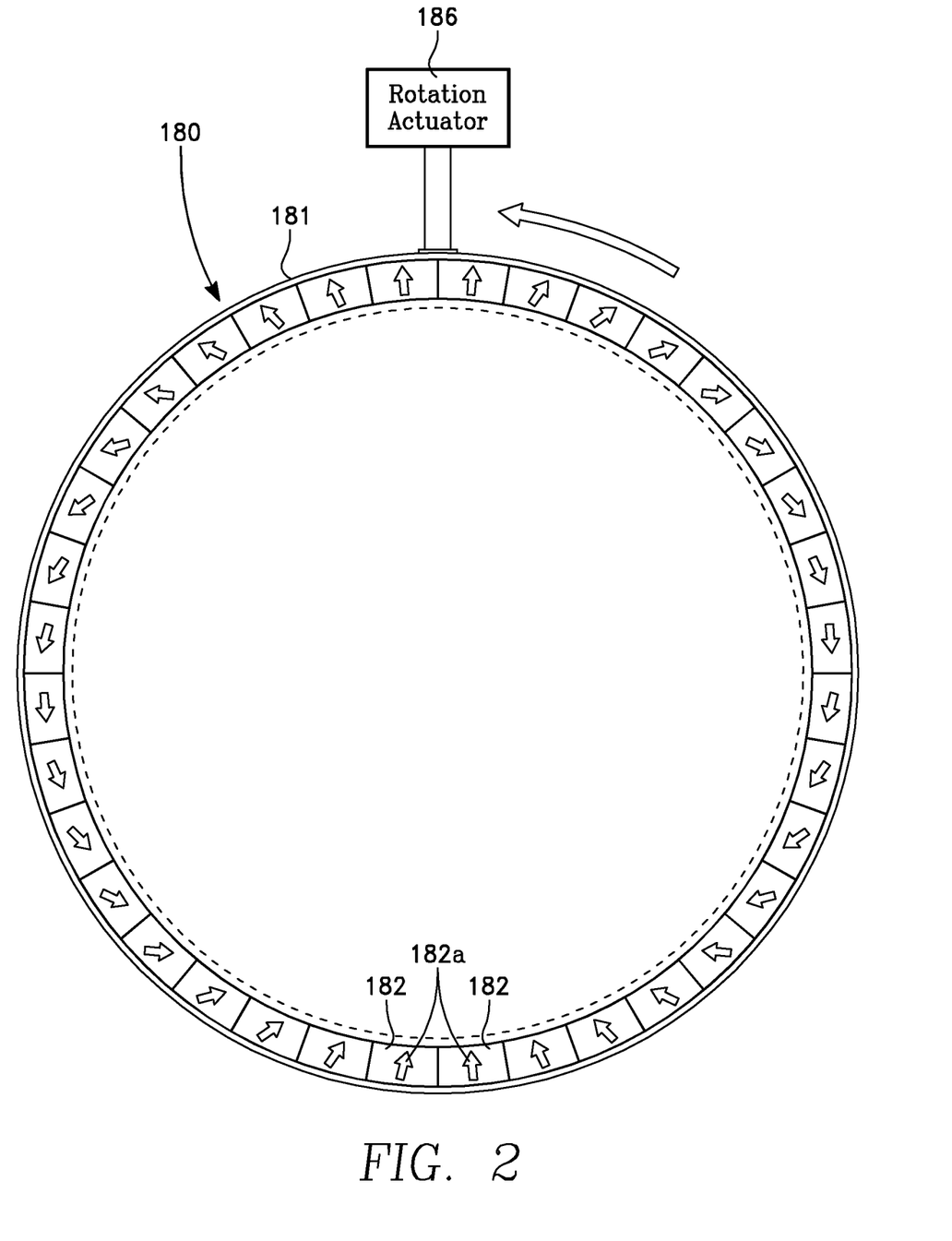
FIG. 2 is a plan view in accordance with an embodiment.
Figure 3:
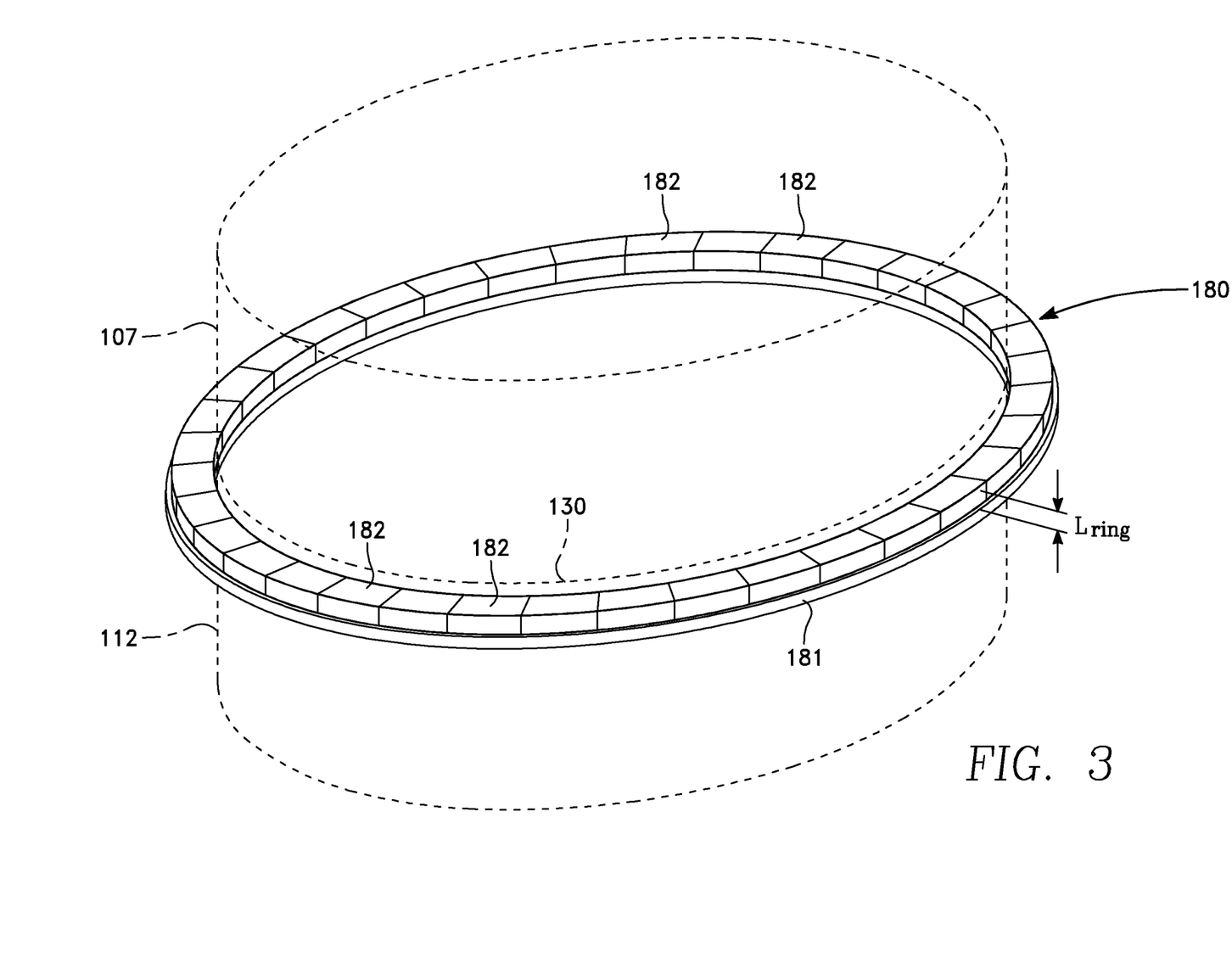
FIG. 3 is an orthographic projection corresponding to FIG. 2.
Figure 3A:
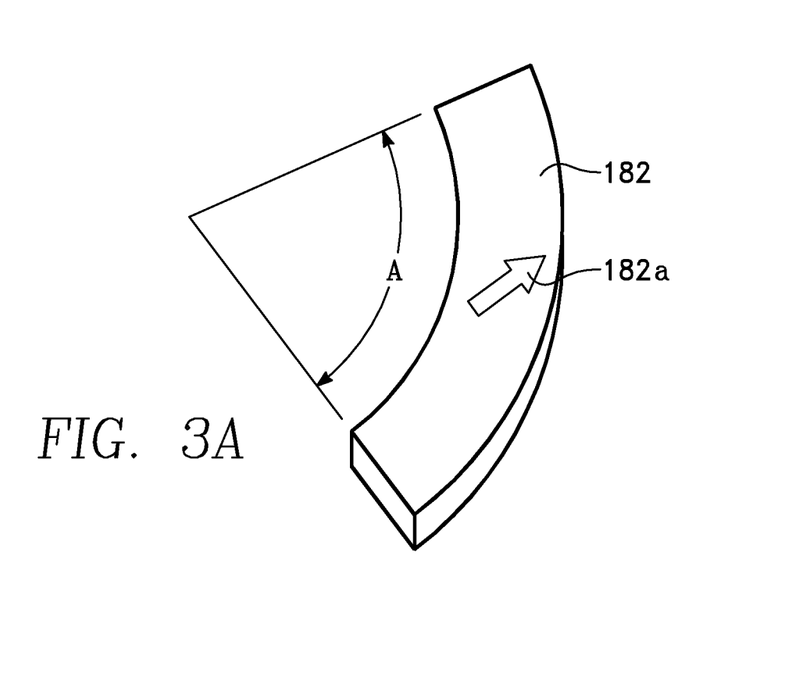
FIG. 3A depicts one arcuate magnet or element in the embodiment of FIG. 3.
Figure 4:
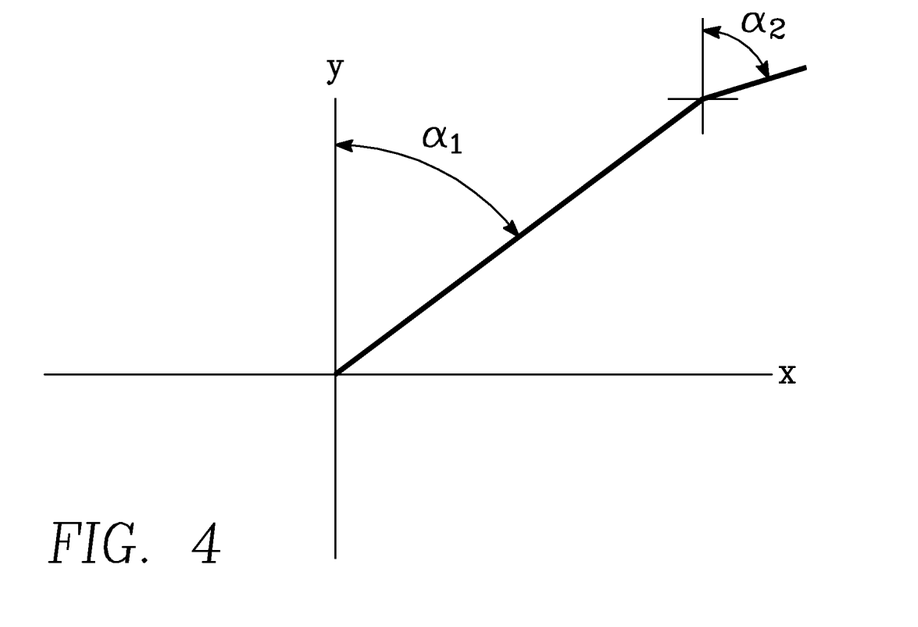
FIG. 4 is a graph depicting magnetic orientation as a function of angular position of a magnet.

A ring-shaped embodiment of the magnetic filter 180 is depicted in FIGS. 2 and 3, in which the magnetic filter 180 is formed as a ring-shaped succession of individual arc-shaped magnets 182 having individual fixed magnetic orientations indicated by individual arrows 182a in each individual magnet 182. Each individual magnet 182 has a relatively small thickness $L_{ring}$. Each individual magnet 182 (shown in FIG. 3A) forms an arc spanning an angle A equal to 360 degrees divided by the number of individual magnets 182. The magnetic orientation of each individual magnet 182 (corresponding to the individual arrow 182a) is rotated relative to the orientation of the adjacent individual magnet by a difference angle equal to a scale factor (e.g., twice) the arc (angle A) subtended by the individual magnet 182. In other embodiments, the difference angle may be a scale factor other than twice. In FIG. 4, the angle $\alpha_1$ is the angular location of an individual magnet 182 about the axis of symmetry, while the angle $\alpha_2$ is the angle of the magnetic orientation (corresponding to the individual arrow 182*a*) of the individual magnet 182.

Each individual magnet 182 may be implemented as either a permanent magnet or an electromagnet.

Figure 5:
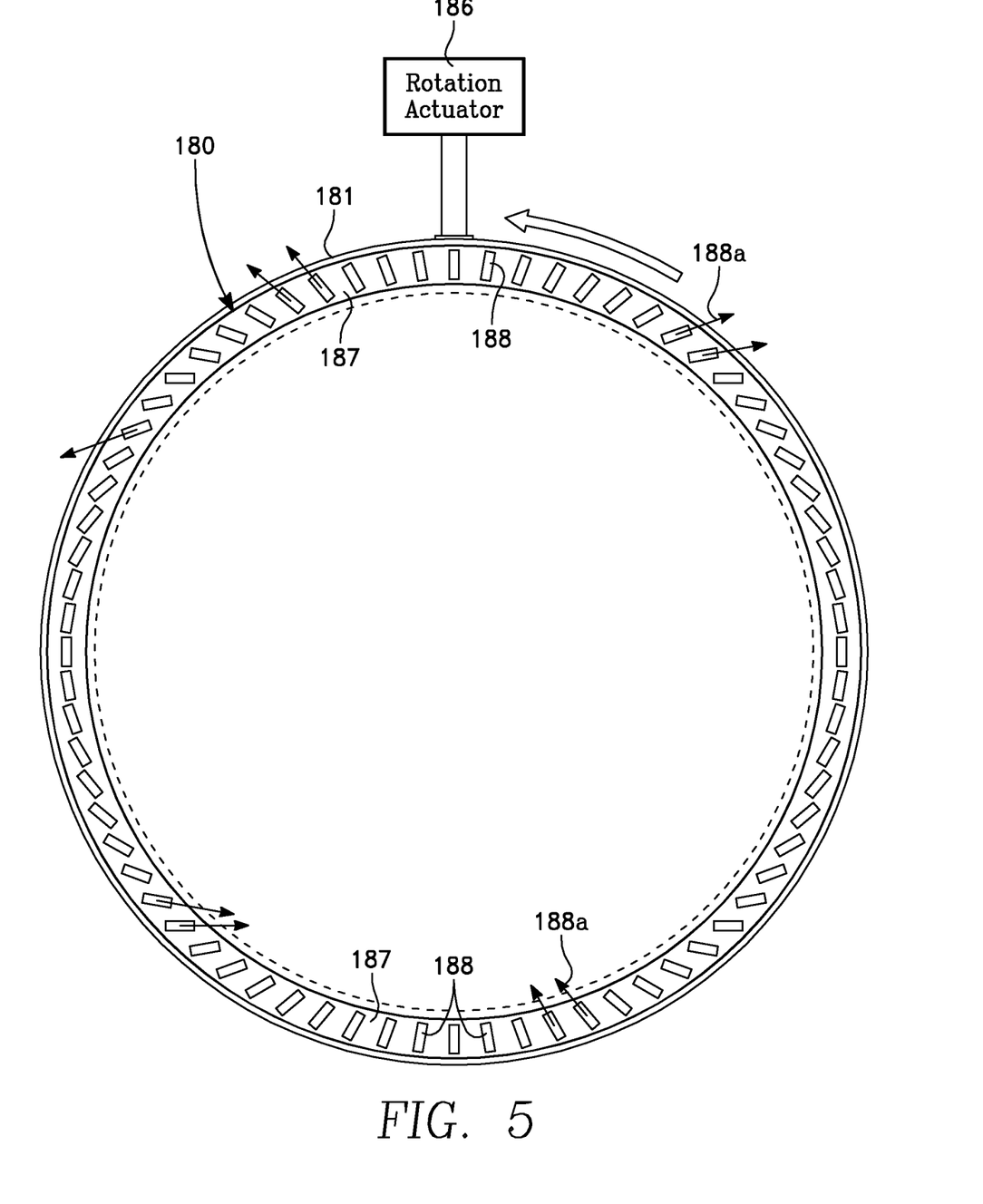
FIG. 5 is a plan view in accordance with a second embodiment.
Figure 6:
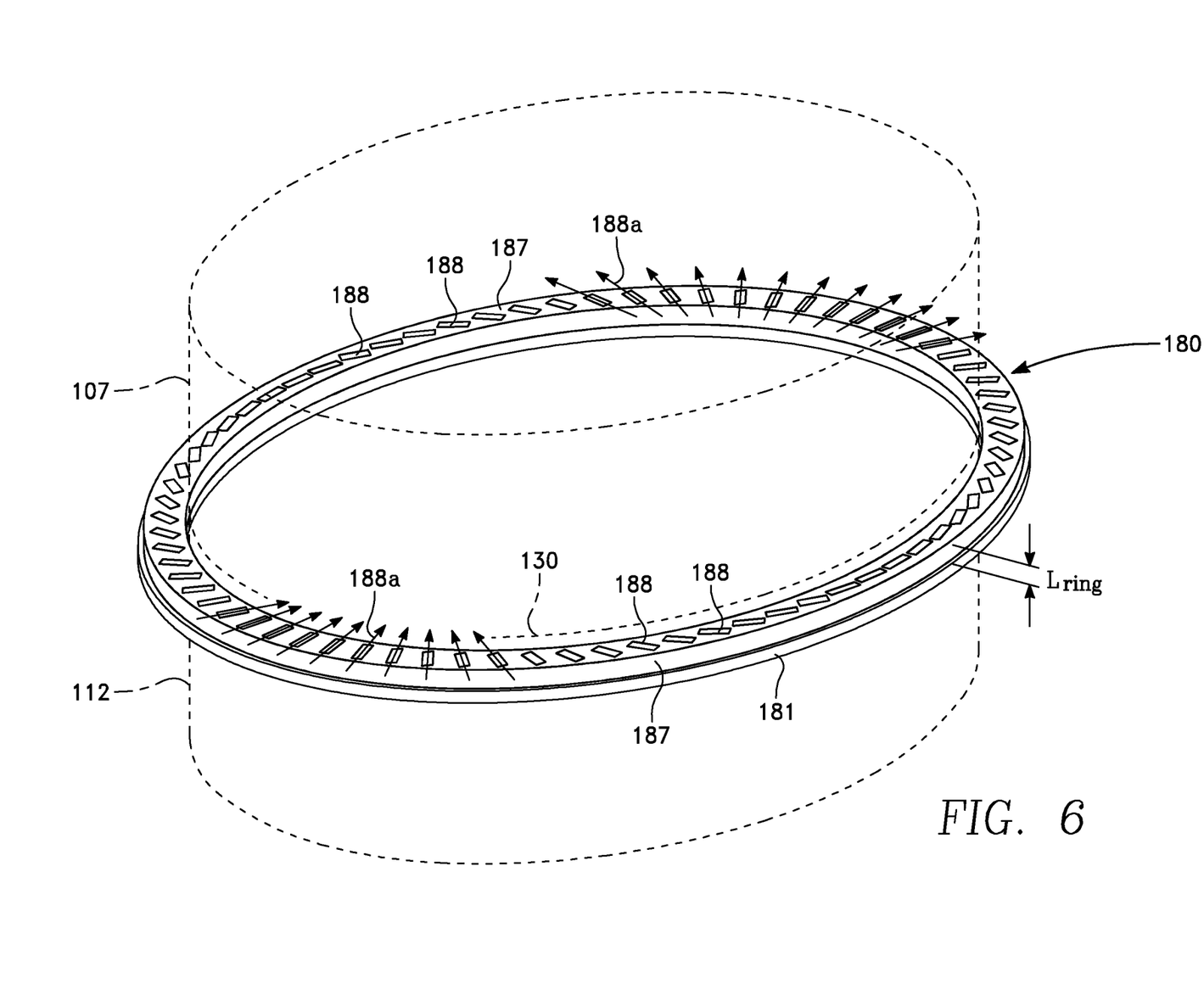
FIG. 6 is an orthographic projection of the embodiment of FIG. 5.

An alternative embodiment is depicted in FIGS. 5 and 6, in which the magnetic filter 180 is formed as a ring-shaped substrate 187 having an annular succession of embedded magnetic inserts 188 in the substrate 187 with magnetizations indicated by the respective arrows 188*a*. The magnetic orientation of each individual magnetic insert 188 (corresponding to a respective arrow 188*a*) is at an angle equal to a scale factor (e.g., twice) the average angle of location of the individual magnetic insert 188 on the ring shaped substrate 187. This is similar to the angular orientation depicted in FIG. 4 with reference to the embodiment of FIGS. 2 and 3. In one embodiment, the ring-shaped substrate 187 may be non-magnetic.

Figure 7:
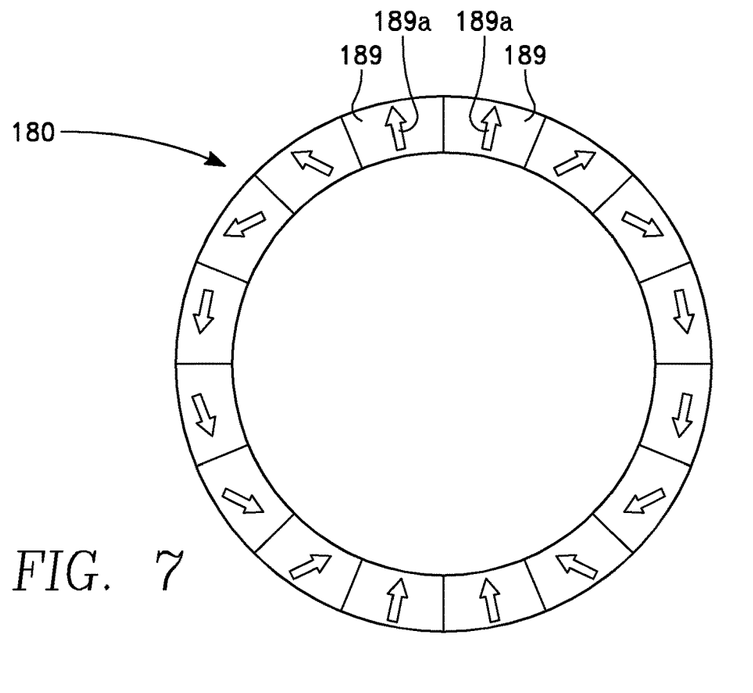
FIG. 7 is a plan view in accordance with a third embodiment.
Figure 8:
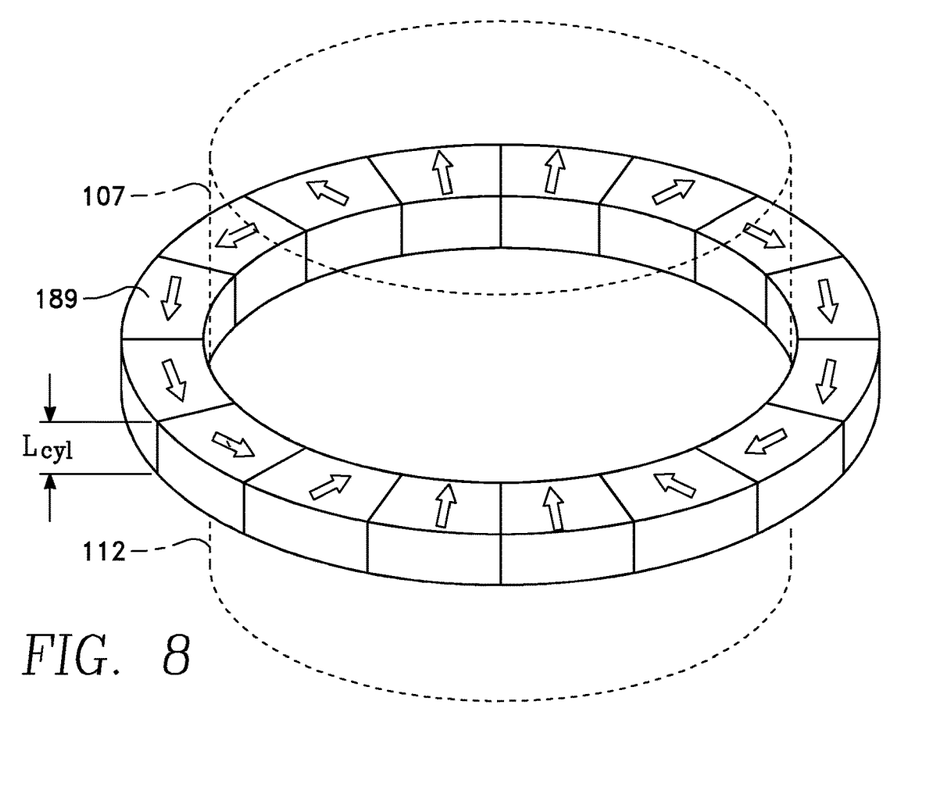
FIG. 8 is an orthographic projection of the embodiment of FIG. 7.

A cylinder-shaped embodiment of the magnetic filter 180 is depicted in FIGS. 7 and 8, having an axial length or thickness $L_{cyl}$ greater than the thickness $L_{ring}$ of the ring-shaped embodiment of FIG. 2. In FIGS. 7 and 8, the magnetic filter 180 is formed as a cylinder-shaped succession of individual arcuate magnets 189 having individual fixed magnetic orientations indicated by individual arrows 189*a* in each individual magnet 189. Each magnet 189 forms an arc spanning an angle equal to 360 degrees divided by the number of individual magnets 189. The magnetic orientation of each individual magnet 189 is rotated relative to the orientation of the adjacent individual magnet by a difference angle equal to a scale factor (e.g., twice) the arc subtended by the individual magnet.

ADVANTAGES

The arrangement of the successive individual magnets of the magnetic filter 180 in the manner of a Halbach array as described above produces a highly uniform transverse magnetic B-field, or uniform flux density. As a result, the magnetic filter can be placed entirely outside of the chamber while still providing uniform results. Location of the magnetic filter 180 outside of the chamber prevents plasma interaction with the magnetic array 180, thereby preventing contamination, and a significant advantage.

Rotation of the magnetic filter 180 about the axis of symmetry 184 by the rotation actuator 186 mitigates or averages out (mitigates) skew attributable to the B-field of the magnetic filter 180 array, or E×B drift.

One additional benefit of the magnetic filter 180 including the Halbach magnet array is the relative compactness of the field range in the direction perpendicular to the primary magnetic field direction—i.e., low fringing above/below the volume enclosed by the magnetic filter 180. This has benefit of not perturbing the plasma generation in the upper chamber 105, and not perturbing the plasma distribution in the lower chamber 110 and the process region 140.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
    an enclosure comprising upper and lower chambers separated at an interface zone;
    a plasma source coupled to said upper chamber and a process chamber coupled to said lower chamber, said process chamber containing a workpiece support; and
    a circular magnetic array surrounding said interface zone and located outside of said enclosure, and comprising a circular succession of individual magnets of individual magnetic orientations with different magnets having different magnetic orientations, each individual magnetic orientation of each respective magnet being in a direction that is a function of an angular location in said circular magnetic array of the respective individual magnet, wherein said circular succession of individual magnets comprises an annular substrate and successive magnetic inserts embedded in the annular substrate.

2. The reactor of claim 1, wherein different magnets have different magnetic orientations in a plane of the circular magnetic array.

3. The reactor of claim 1, wherein the circular succession of individual magnets have magnetic orientations substantially parallel to a plane of the circular magnetic array.

4. A plasma reactor comprising:
    an enclosure comprising upper and lower chambers separated at an interface zone;
    a plasma source coupled to said upper chamber and a process chamber coupled to said lower chamber, said process chamber containing a workpiece support; and
    a circular magnetic array surrounding said interface zone and located outside of said enclosure, and comprising a circular succession of individual magnets of individual magnetic orientations each individual magnetic orientation of each respective magnet being in a direction that is a function of an angular location in said circular magnetic array of the respective individual magnet, wherein said function is such that said direction is disposed at an angle twice the angle of said angular location.

5. A plasma reactor comprising:
    an enclosure comprising upper and lower chambers separated at an interface zone;
    a plasma source coupled to said upper chamber and a process chamber coupled to said lower chamber, said process chamber containing a workpiece support; and
    a circular magnetic array surrounding said interface zone and located outside of said enclosure and comprising a circular succession of individual magnets disposed around an axis of symmetry of the circular magnetic array, wherein each respective individual magnet of the succession of individual magnets has a respective magnetic moment with at least a portion of the respective moment extending along a respective axis in a plane of the circular magnetic array, wherein the portion of each respective magnetic moment of each respective individual magnet extends in the plane of the circular magnetic array in a direction that forms an angle with respect to a radius connecting the respective individual magnet to the axis of symmetry, and wherein different magnets have portions of the magnetic moments in the plane of the circular magnetic array that extend in directions at different angles with respect to the radius connecting the respective individual magnet to the axis of symmetry.

6. The reactor of claim 5, wherein the circular succession of individual magnets have magnetic orientations substantially parallel to a plane of the circular magnetic array.

7. The reactor of claim 5 wherein said individual magnets have magnetic moments distributed in conformance with a Halbach array.

8. The reactor of claim 5 wherein said circular magnetic array is rotatable relative to said process chamber about the axis of symmetry of said circular magnetic array, said reactor further comprising a rotation actuator coupled to said circular magnetic array.

9. The reactor of claim 5 wherein said interface zone comprises a magnetically transparent ring.

10. The reactor of claim 5 wherein each one of said individual magnets is shaped as an arcuate section, said arcuate section spanning an angle equal to 360 degrees divided by the number of individual magnets in said circular magnetic array.

11. The reactor of claim 5 wherein said circular succession of individual magnets comprises an annular substrate and successive magnetic inserts embedded in the annular substrate.

12. The reactor of claim 5 wherein said individual magnets comprises permanent magnets or electromagnets.

13. The reactor of claim 5 further comprising:
   an ion extractor between said lower chamber and said process chamber.

14. The reactor of claim 13 wherein said ion extractor comprises a pair of opposing grids and an AC source having opposing terminals coupled to said opposing grids.

* * * * *